(12) United States Patent
Chung et al.

(10) Patent No.: US 10,266,393 B2
(45) Date of Patent: Apr. 23, 2019

(54) MEMS DEVICE AND PROCESS

(71) Applicant: Cirrus Logic International Semiconductor Ltd., Edinburgh (GB)

(72) Inventors: Colin Wei Hong Chung, Edinburgh (GB); Scott Lyall Cargill, Edinburgh (GB); Colin Robert Jenkins, Linlithgow (GB)

(73) Assignee: Cirrus Logic, Inc., Austin, TX (US)

( * ) Notice: Subject to any disclaimer, the term of this patent is extended or adjusted under 35 U.S.C. 154(b) by 104 days.

(21) Appl. No.: 15/414,178

(22) Filed: Jan. 24, 2017

(65) Prior Publication Data
US 2017/0217761 A1    Aug. 3, 2017

Related U.S. Application Data

(60) Provisional application No. 62/288,130, filed on Jan. 28, 2016.

(30) Foreign Application Priority Data

Mar. 14, 2016  (GB) .................................. 1604309.3
Jan. 19, 2017  (GB) .................................. 1700944.0

(51) Int. Cl.
*B81B 7/00*  (2006.01)
*B81C 1/00*  (2006.01)
(Continued)

(52) U.S. Cl.
CPC ............ *B81B 7/0061* (2013.01); *B81B 3/007* (2013.01); *B81C 1/00158* (2013.01);
(Continued)

(58) Field of Classification Search
CPC ... G01L 9/0042; G01L 9/0073; H04R 19/005; H04R 19/04; H04R 31/00;
(Continued)

(56) References Cited

U.S. PATENT DOCUMENTS 8,072,010 B2 * 12/2011 Lutz ..................... B81B 3/0072
                                                    257/254
8,983,097 B2 *  3/2015 Dehe .................... B81B 3/0078
                                                    381/113
(Continued)

FOREIGN PATENT DOCUMENTS

CN    204425633 U    6/2015
GB       2506174      3/2014
(Continued)

OTHER PUBLICATIONS

Combined Search and Examination Report under Sections 17 and 18(3), Application No. GB1604309.3, dated Sep. 12, 2016, 9 pages.
(Continued)

*Primary Examiner* — Oyesola C Ojo
(74) *Attorney, Agent, or Firm* — Jackson Walker L.L.P.

(57) ABSTRACT

The application describes MEMS transducers having a vent structure provided in a flexible membrane of the vent structure The vent structure comprises at least one moveable portion and the vent structure is configured such that, in response to a differential pressure across the vent structure, the moveable portion is rotatable about first and second axes of rotation, which axes of rotation extend in the plane of the membrane.

33 Claims, 14 Drawing Sheets

(51) Int. Cl.
*G01L 9/00* (2006.01)
*H04R 19/04* (2006.01)
*H04R 19/00* (2006.01)
*H04R 31/00* (2006.01)
*B81B 3/00* (2006.01)

(52) U.S. Cl.
CPC .......... *G01L 9/0042* (2013.01); *G01L 9/0073* (2013.01); *H04R 19/005* (2013.01); *H04R 19/04* (2013.01); *H04R 31/00* (2013.01); *B81B 2201/0257* (2013.01); *B81B 2201/0264* (2013.01); *B81B 2203/0109* (2013.01); *B81B 2203/0118* (2013.01); *B81B 2203/0127* (2013.01); *B81B 2203/058* (2013.01); *B81B 2207/012* (2013.01); *H01L 2224/16225* (2013.01); *H01L 2224/48091* (2013.01); *H01L 2224/48227* (2013.01); *H01L 2924/15151* (2013.01); *H04R 2201/003* (2013.01); *H04R 2499/11* (2013.01)

(58) Field of Classification Search
CPC .......... H04R 2201/003; H04R 2499/11; H01L 2224/16225; H01L 2224/48091; H01L 2224/48227; H01L 2924/15151; B81B 7/0061; B81B 2201/0257; B81B 2201/0264; B81B 2203/0118; B81B 2203/0127; B81B 2203/058; B81B 2207/012; B81C 1/00158
USPC .......................................................... 381/175
See application file for complete search history.

(56) References Cited

U.S. PATENT DOCUMENTS

| | | | | |
|---|---|---|---|---|
| 8,987,844 | B2* | 3/2015 | Jenkins | B81B 3/0021 257/416 |
| 9,002,037 | B2* | 4/2015 | Dehe | B81B 7/0029 381/113 |
| 9,591,408 | B2* | 3/2017 | Dehe | B81B 3/0078 |
| 9,788,124 | B2* | 10/2017 | Schelling | H04R 19/04 |
| 9,876,446 | B2* | 1/2018 | Dehe | H04R 7/10 |
| 2006/0255883 | A1* | 11/2006 | Ebuchi | H03H 3/02 333/191 |
| 2008/0212409 | A1* | 9/2008 | Lutz | B81B 3/0072 367/181 |
| 2012/0250909 | A1* | 10/2012 | Grosh | H04R 7/06 381/174 |
| 2013/0223023 | A1 | 8/2013 | Dehe et al. | |
| 2014/0084396 | A1* | 3/2014 | Jenkins | B81B 3/0021 257/419 |
| 2015/0014796 | A1 | 1/2015 | Dehe | |
| 2015/0041931 | A1* | 2/2015 | Szczech | B81B 7/0029 257/416 |
| 2015/0078593 | A1* | 3/2015 | Uchida | H04R 19/005 381/191 |
| 2015/0207435 | A1* | 7/2015 | Rombach | H02N 1/08 310/300 |

FOREIGN PATENT DOCUMENTS

| | | |
|---|---|---|
| GB | 2506979 A | 4/2014 |
| GB | 2533410 A | 6/2016 |
| WO | 2006123263 A1 | 11/2006 |

OTHER PUBLICATIONS

Search and Examination Report under Sections 17 and 18(3), U.K. Intellectual Property Office, Application No. GB1700944.0, dated May 30, 2017.
International Search Report and Written Opinion of the International Searching Authority, International Application No. PCT/GB2017/050166, dated Apr. 18, 2017.
Search and Examination Report under Sections 17 and 18(3), U.K. Intellectual Property Office, Application No. GB1700944.0, dated Aug. 25, 2017.
Search and Examination Report under Sections 17 and 18(3), U.K. Intellectual Property Office, Application No. GB1801317.7, dated Apr. 12, 2018.
Examination Opinion, Taiwan Intellectual Property Office, TW Application No. 106103161, dated Nov. 27, 2018.

* cited by examiner

FIG. 4b

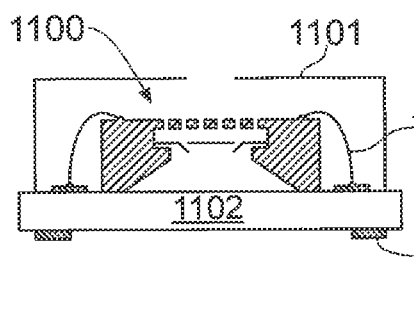
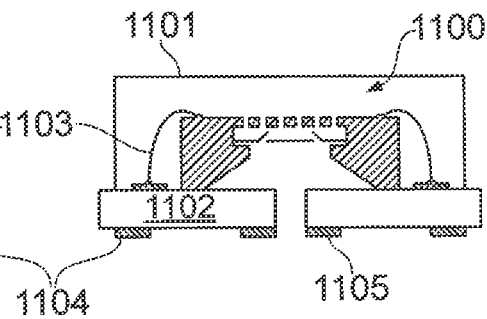
FIG. 8a    FIG. 8b
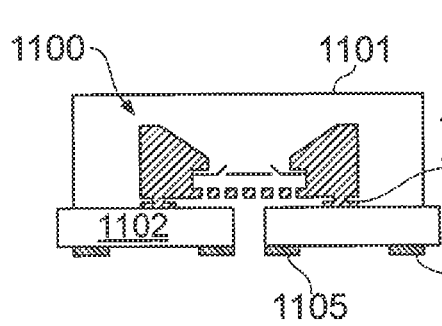
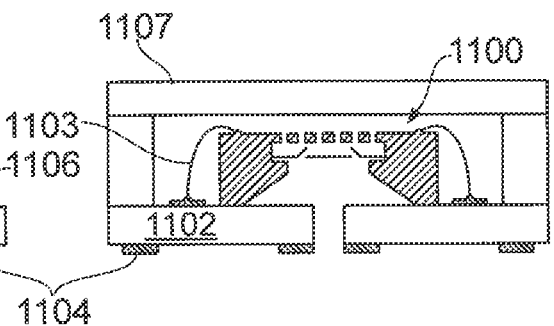
FIG. 8c    FIG. 8d
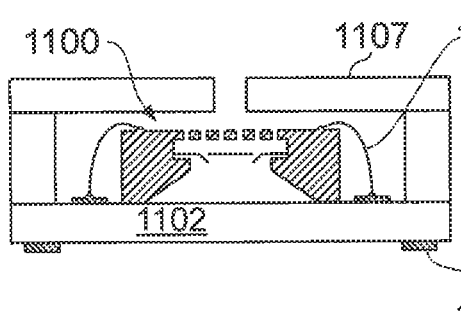
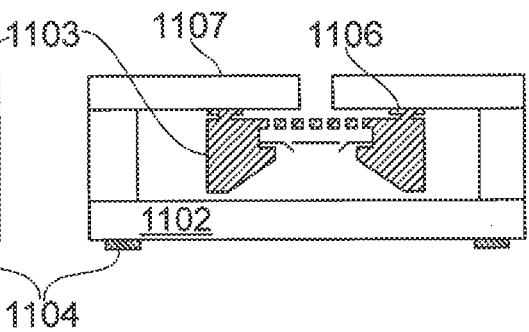
FIG. 8e    FIG. 8f
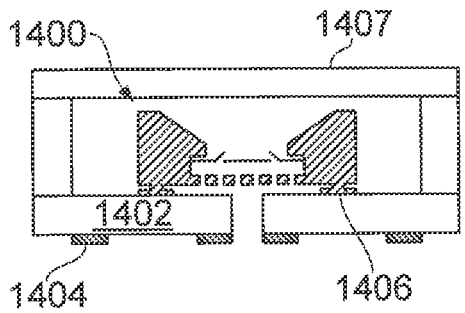
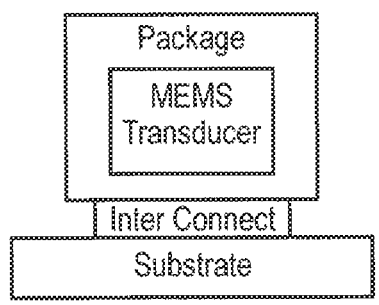
FIG. 8g    FIG. 8h

MEMS DEVICE AND PROCESS

FIELD OF DISCLOSURE

This invention relates to a micro-electro-mechanical system (MEMS) device and process, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between a pair of electrodes which will vary as the distance between the electrodes changes in response to sound waves incident on the membrane surface.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

It should also be noted that whilst FIGS. 1a and 1b show the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 102 and the upper electrode 103 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without impacting on sensitivity at the desired acoustic frequencies.

The transducer shown in FIGS. 1a and 1b is illustrated with substantially vertical side walls supporting the membrane layer 101 in spaced relation from the back-plate 104. Given the nature of the deposition process this can lead to a high stress concentration at the corners formed in the material layer that forms the membrane. Sloped or slanted side walls may be used to reduce the stress concentration. Additionally or alternatively it is known to include a number of support structures such as columns to help support the membrane in a way which reduces stress concentration.

Such columns are formed by patterning the first sacrificial material used to define the first cavity 109 such that the substrate 105 is exposed in a number of areas before depositing the material forming the membrane layer 101. However, this process can lead to dimples in the upper surface of the back-plate layer in the area of the columns.

MEMS transducers such as those shown in FIGS. 1*a* and 1*b* may usefully be used in a range of devices, including portable devices. Especially when used for portable devices it is desirable that the MEMS transducers are sufficiently rugged to survive expected handling and use of the device. There is therefore a general desire to improve the resilience of MEMS devices.

Thus, to be useful for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound/acoustic port for a MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

In response to a high pressure impulse however the membrane layer 101 may exhibit a greater amount of deformation than usual. FIG. 2*a* illustrates the situation where the membrane has been deformed downwards following a high pressure event and FIG. 2*b* shows the situation where the membrane has been displaced upwards.

Consider the situation where the microphone is arranged to receive incident sound from a sound port arranged above the back-plate 104 and the sound port pressure suddenly increases, for instance as a result of air trapped when the device falls being forced into the sound port. This may result the pressure in the second cavity 110 being significantly greater than the pressure in the first cavity 109, displacing the membrane downwards to greater extent than is usual. This may result in a relatively large stress at point 301 where membrane layer 101 forms part of the sidewall of supporting structure 201 and, in some instances, may thus result in delamination of the membrane layer from the rest of the sidewall structure. Further, if the pressure difference is great enough the membrane may make contact with the substrate 105 at the edge of the substrate defined by the side wall 202 of the opening of substrate cavity 108. Typically the edge of the substrate at the location of the opening of substrate cavity has a relatively sharp angle and thus the membrane may be deformed round this edge, leading to a large stress concentration at this point 302.

As mentioned previously the membrane layer 101 will typically be formed from one or more thin layers of semiconductor material, such as silicon nitride. Whilst such a material can be flexible when subject to even stresses if there is a significant localised out-of-plane stress, such as may be introduced into the membrane at point 302 by contact with the edge of the opening of substrate cavity 108, the membrane material can be relatively brittle. Thus contact between the membrane and the edge of the opening of substrate cavity in this way can lead to damage such as cracking of the membrane.

The bleed holes discussed above with relation to FIGS. 1*a* and 1*b* will provide a flow path between the first and second cavities and thus flow of air through the bleed holes will reduce the pressure differential acting on the membrane over time. However the bleed holes are typically deliberately arranged to provide a limited amount of flow so as to provide a desired frequency response. Thus a high pressure differential may be maintained across the membrane for a relatively long period of time before flow through the bleed holes acts to equalise the pressures in the first and second cavities. The time taken to equalise via the bleed holes could be changed by altering the size and/or number of bleed hole but this may impact negatively on transducer performance.

As the high pressure caused by trapped air may persist for a relatively long time, the pressure in the first and second cavities may equalise by virtue of the bleed holes as discussed. Thus the pressure in the first cavity, and substrate cavity, may increase until the pressures are equalized. However once air is no longer being forced into the sound port the pressure in the sound port will reduce quite quickly and, as typically the back-plate has a low acoustic impedance, the pressure in the second cavity will quickly reduce. At this point the pressure in the first cavity may be significantly greater than the pressure in the second cavity and thus the membrane may be deformed upwards, again to a greater extent than may usually be in the case. Again this may lead to a significant stress in region 301 where the membrane layer 101 meets the sidewall of the supporting structure. If the pressure difference is large enough the membrane may be displaced far enough to contact the back-plate 104. This may limit the amount of travel of the membrane as compared with the situation shown in FIG. 2*a* but again this may introduce stress into the membrane layer at the point 303 where it contacts the back-plate 104. Again it may take a while for this pressure differential to reduce by virtue of flow through the bleed holes.

It should be appreciated that both of these situations can also occur when sound is received via the substrate cavity 108 but in the opposite order.

FIGS. 3*a* to 3*c* show a previously proposed MEMS transducer comprising a flexible membrane 101 and a variable vent structure 401 in the form of a moveable portion or "flap" 402. The moveable flap portion is defined by a thin channel 403 which runs through the membrane and partially separates the moveable flap portion from the rest of the membrane whilst remaining attached to the rest of the membrane via a connecting portion 404.

The moveable flap portion 402 is arranged such that its equilibrium position—i.e. the position it adopts with substantially no pressure differential acting on the moveable portion, is within the plane of the membrane. In response to a pressure differential across the moveable portion of the vent structure the moveable portion is deflected away from the plane of the membrane so as to expose a hole in the membrane. In this way, the size of a flow path through the vent structure between a first volume above the membrane to a second volume below the membrane is varied in response to a variable pressure differential acting on the moveable portion.

FIG. 3b illustrates in perspective view the part of the membrane and the variable vent. In this example the pressure in the volume below the membrane is sufficiently greater than the pressure in the volume above the membrane such that the moveable flap portion 402 has been deflected upwards away from the rest of the membrane surface. This opens the flow channel through the membrane, i.e. effectively opens a hole in the substrate. If the pressure differential increases enough the moveable portion 402 may be further deflected and thus provide a greater amount of opening, i.e. a greater flow path.

The moveable portion may thus adopt a range of positions. These positions depend on the pressure differential acting on the moveable portion (or the variable vent). The extent to which the moveable portion is deflected also determines how much the moveable portion blocks/exposes the hole through the membrane and thus the size of the flow path.

The structure shown in FIGS. 3a to 3c has been shown to act so to reduce the pressure differential acting on the membrane at relatively high pressure differentials. However, pressure impulse profiles arising as a result of e.g. air being forced into the sound port of a host device due to an impact, can often peak within a few milliseconds. Thus, unless the vent structure can respond quickly, ideally within this time range, damage may still be sustained by a high pressure or an "overpressure" event

SUMMARY

The present invention is concerned with improving the resilience of MEMS devices to a high pressure impulse incident on a MEMS transducer. In particular, the present invention is concerned with improving the response time of a vent structure provided on a flexible membrane of a MEMS transducer. Thus, the present invention is concerned with facilitating an equalization of a pressure differential arising between the upper and lower surfaces of the membrane.

According to an aspect of the present invention there is provided a MEMS transducer comprising: a flexible membrane, the flexible membrane having a vent structure comprising at least one moveable portion, wherein the vent structure is configured such that, in response to a differential pressure across the vent structure, the moveable portion is rotatable about first and second axes of rotation, which axes or rotation extend in the plane of the membrane.

According to a further aspect of the present invention there is provided a MEMS transducer comprising: a flexible membrane, the flexible membrane having a vent structure comprising at least one moveable portion connected to the membrane by a single joint structure, wherein the vent structure is configured such that, in response to a differential pressure across the vent structure, the moveable portion is rotatable about a first axis of rotation which extends in the plane of the membrane and a second axis of rotation which is substantially orthogonal to the first axis of rotation and which extends in the plane of the moveable portion, wherein the first axis of rotation and the second axis of rotation intersect at the joint structure.

In response to a differential pressure across the moveable portion of the vent structure the moveable portion deflects to reveal a variable-size aperture in the flexible membrane. Thus, in response to a differential pressure across the moveable portion of the vent structure the moveable portion deflects to provide a flow path through the flexible membrane. The size of the aperture and thus the flow path increases as the moveable portion deflects. This facilitates an equalisation of the pressure acting on the opposing surfaces of the membrane and tends to restore the moveable portion to its equilibrium position.

The flexible membrane exhibits an equilibrium position which can be considered to correspond to the minimum size of the flow path through the flexible membrane. Thus, at the equilibrium position, the differential pressure across the vent structure is insufficient to cause deflection of the moveable portion and the size of the flow path through the membrane is minimal/negligible.

In response to a differential pressure across the vent structure the moveable portion can potentially rotate about two axes of rotation. At equilibrium both axes of rotation can be considered to substantially extend within the plane of the membrane. However, once the moveable portion has deflected above or below the plane of the membrane, the second axis of rotation can be considered to extend in the plane of the moveable portion. The axes of rotation may be mutually orthogonal or may be non-orthogonal to one another.

The axes of rotation can be conveniently defined with respect to a joint structure or "hinge" which connects the/each moveable portion to the flexible membrane. The joint structure may be defined by one or more channels provided within the membrane layer. The joint structure may, for example, comprise a simple connecting portion—or "neck" of membrane material—that forms a connection between the moveable portion and the rest of the flexible membrane. Thus, the moveable portion may be defined by a slit or channel which extends through the membrane material to thereby separate the moveable portion from the rest of the membrane and thus to define a perimeter shape of the moveable portion. In its simplest form the joint structure may comprise a connecting portion that is defined between two terminating ends, or two terminating regions, of the channel. The joint structure may further comprise a substantially elongate beam structure which extends adjacent to the connecting portion and which is located between the rest of the membrane and the connecting portion.

Thus, the channel that defines the moveable portion can be considered to define a path between two endpoints of the channel. Each endpoint can be considered to be at a terminating region of the channel. A width of the connecting portion defined between the terminating regions of the channel can be considered to be the distance between a first point on one terminating region of the channel and a corresponding point on the other terminating region of the channel.

A first axis of rotation can be considered to substantially coincide with, or be parallel to, a width of the joint structure. Thus, the first axis of rotation may coincide with, or be parallel to, a width across a connecting portion formed between two terminating ends, or terminating regions, of a channel which separates the moveable portion from the rest of the membrane. Alternatively, the first axis of rotation may coincide with, or be parallel to, the longitudinal section of a substantially elongate beam of the joint structure. Rotation of the moveable portion about this first axis of rotation will cause the moveable portion to deflect above or below the rest of the surface of the membrane, depending on the resultant forces acting on the vent structure.

At equilibrium, the second axis of rotation also extends in the plane of the membrane and has a component that is substantially perpendicular to a width of the joint structure. Rotation of the moveable portion about this second axis of rotation tends to cause one lateral edge/corner (depending on the shape of the moveable portion) of the moveable portion to deflect upwardly with respect to the plane of the membrane surface whilst the opposite lateral edge/corner deflects downwardly with respect to the plane of the membrane surface.

Thus, the joint structure can be considered to comprise a double hinge which allows the, or each, moveable portion to rotate about first and second rotational axes.

Thus, the moveable portion is able to "tilt" about the joint structure relative to the plane of the membrane by rotating about the second axis of rotation. This tilting about the second rotational axis which tends to occur initially following a high pressure event, tends to results in a larger proportion of the aperture being initially exposed than would be revealed if the moveable portion were constrained to rotate only about the first axis of rotation.

The ability of the moveable portion to rotate about the second axis of rotation advantageously enables the vent structure to open more quickly in response to a differential pressure across the membrane. This beneficially results in a more rapid equalisation of pressure across the membrane following a pressure impulse event.

According to another aspect of the present invention there is provided a MEMS transducer comprising: a flexible membrane, the flexible membrane having a vent structure comprising at least one moveable portion, wherein the/each moveable portion is connected to the membrane by a joint structure having a width, the vent structure being configured such that, in response to a differential pressure across the vent structure, the moveable portion is rotatable about an axis of rotation which has a component that is perpendicular to the width of the joint structure.

Thus, the vent structure may be configured such that rotation of the moveable portion takes place about an axis of rotation that has a component perpendicular to the widthways direction of the joint structure. This can, for example, be as a result of the shape of the moveable portion(s) and/or the manner in which each moveable portion is connected to the rest of the membrane.

According to another aspect of the present invention there is provided a MEMS transducer comprising: a flexible membrane, the flexible membrane having a vent structure comprising at least one moveable portion, wherein the moveable portion is connected to the rest of the membrane by a joint structure, and wherein a notional line which extends from the centre of the connecting portion across the moveable portion in a direction that is substantially orthogonal to the width of the connecting portion, dissects the moveable portion into first and second sections, the first section having a greater surface area than the second section.

According to another aspect of the present invention there is provided a MEMS transducer comprising: a flexible membrane, the flexible membrane having a vent structure comprising at least one moveable portion, wherein the moveable portion is connected to the rest of the membrane by a connecting portion having a width, and wherein the moveable portion is asymmetrical about a notional line which extends from the centre of the connecting portion across the moveable portion in a direction that is substantially orthogonal to the width of the connecting portion.

As a result of a differential pressure across the vent structure a resultant force acts on the moveable portion causing it to deflect. Thus, in circumstances such as an impact event which leads to a difference between the pressure (i.e. force/unit area) acting on one planar surface of the moveable portion and the pressure acting on the opposite planar surface of the moveable portion, a resultant force acts on the surface of the moveable portion in the direction of the greater pressure.

As a result of a differential pressure across the vent (e.g. in a direction from the upper surface to the lower surface of the moveable portion or visa versa) a greater overall force will act on the larger surface area of one section of the moveable portion than on the small surface area of the section. This causes a rotation of the moveable portion about the second axis of rotation.

According to another aspect there is provided a MEMS transducer comprising: a flexible membrane, the flexible membrane having a vent structure comprising at least one moveable portion and a joint structure provided on a connecting edge of the moveable portion which connects the moveable portion to the flexible membrane, wherein the joint structure is provided at an off-centre position on the connecting edge.

According to another aspect of the present invention there is provided a MEMS transducer comprising: a flexible membrane, the flexible membrane having a vent structure comprising at least one moveable portion, wherein the moveable portion is connected to the rest of the membrane by a joint structure, and wherein a notional line which extends substantially orthogonally from the centre of the joint structure across the moveable portion, dissects the moveable portion into first and second sections such that, in response to a differential pressure across the membrane, the resultant force arising on the first portion induces a moment about the notional line that is greater than a moment induced by resultant forces arising on the second portion.

According to another aspect of the present invention there is provided a MEMS transducer comprising a vent structure, the vent structure comprising a moveable portion which, in response to a differential pressure across the vent structure, tilts such that one edge of the moveable portion deflects below the plane of the membrane whilst an opposite edge of the moveable portion deflects above the plane of the membrane.

In general there is provided a MEMS transducer that comprises at least one vent structure provided in a flexible membrane of the transducer. The MEMs transducer may be a capacitive microphone. The flexible membrane may be supported between a first volume and a second volume and a flow path may be provided between the first and second volumes by means of the vent. The vent structure may comprise a moveable portion which is moveable so as to open a hole extending from the first volume to the second volume. The moveable portion may quiescently occupy at least some, and possibly most, of the area of the hole, but is moveable in response to a local pressure differential across the hole so as to vary the size of the hole which is open to provide a flow path. In other words the moveable portion may, in equilibrium, effectively close at least part of the hole, but is moveable so as to vary to degree to which the hole is closed. The moveable portion is preferably arranged to remain closing the hole, i.e. aperture, at normal operating pressure differentials but to more to increase the size of the flow path, e.g. close less of the hole, at higher pressure differentials that could potentially cause damage to the membrane. The vent can therefore be seen as a variable aperture.

The vent structure thus acts as a type of pressure relief valve to reduce the pressure differential acting on the membrane. However unlike, the bleed holes in the membrane (if present) which have a fixed area and thus a fixed size of flow path, the variable vent has a flow path size, i.e. aperture, which varies in response to a pressure differential. Thus the degree to which the vent allows venting depends on the pressure differential acting on the vent—which clearly depends on the pressure of at least one of the first and second volumes. The vent structure therefore provides a variable acoustic impedance.

The transducer may comprise a back-plate structure wherein the flexible membrane layer is supported with respect to said back-plate structure. The back-plate structure may comprises a plurality of holes through the back-plate structure. When at least one vent structure is formed in the flexible membrane layer at least one of the holes through the back-plate structure may comprise a vent hole in a location that corresponds to the location of a vent structure in the flexible membrane layer. The area of the vent hole in the back-plate may extend laterally away from the area of opening of the vent in the flexible membrane at a position where the variable vent in the flexible membrane first opens. When at least one vent structure is formed in the flexible membrane layer and comprises a moveable portion which is connected to the rest of the membrane via a beam structure and the moveable portion and beam structure are defined by channels running through the flexible membrane; then the location of the channels in the membrane which do not form part of the variable flow path through the membrane in use may be arranged so as to not substantially overlap with the location of any of said plurality of holes in the back-plate structure.

The transducer may be a capacitive sensor such as a microphone. The transducer may comprise readout circuitry (analogue and/or digital). The transducer and circuitry may be provided together on a single semiconductor chip—e.g. an integrated microphone. Alternatively, the transducer may be on one chip and the circuitry may be provided on a second chip. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

Features of any given aspect may be combined with the features of any other aspect and the various features described herein may be implemented in any combination in a given embodiment.

Associated methods of fabricating a MEMS transducer are provided for each of the above aspects.

BRIEF DESCRIPTION OF THE DRAWINGS

The invention will now be described by way of example only with reference to the accompanying drawings, in which:

FIGS. 4a-4c illustrate a flexible membrane having vent structure according to a first example in which the vent structure is in the equilibrium position;

FIGS. 8a to 8h illustrate various MEMS transducer packages.

DETAILED DESCRIPTION

Figure 1A:
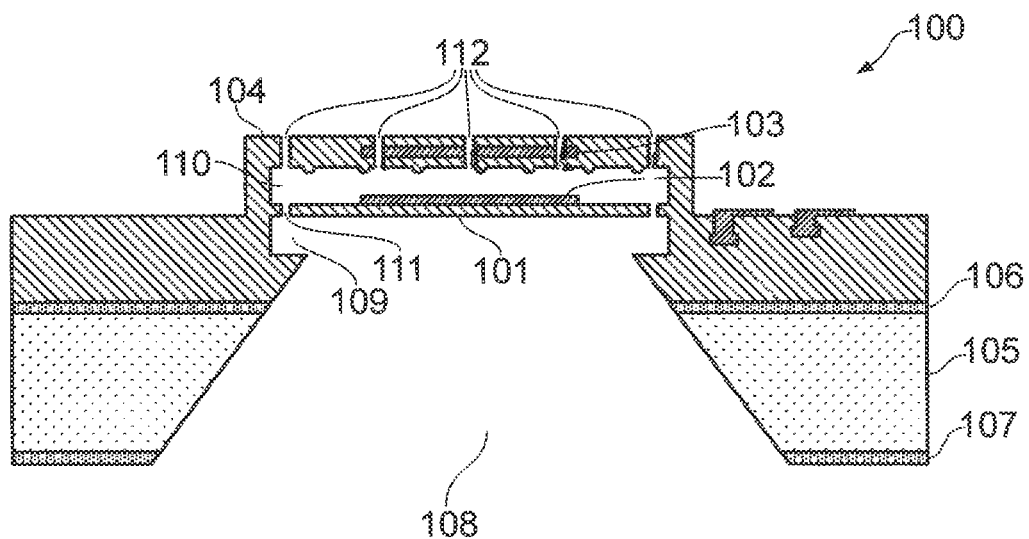
FIGS. 1a and 1b illustrate known capacitive MEMS transducers in section and cut-away perspective views.
Figure 1B:
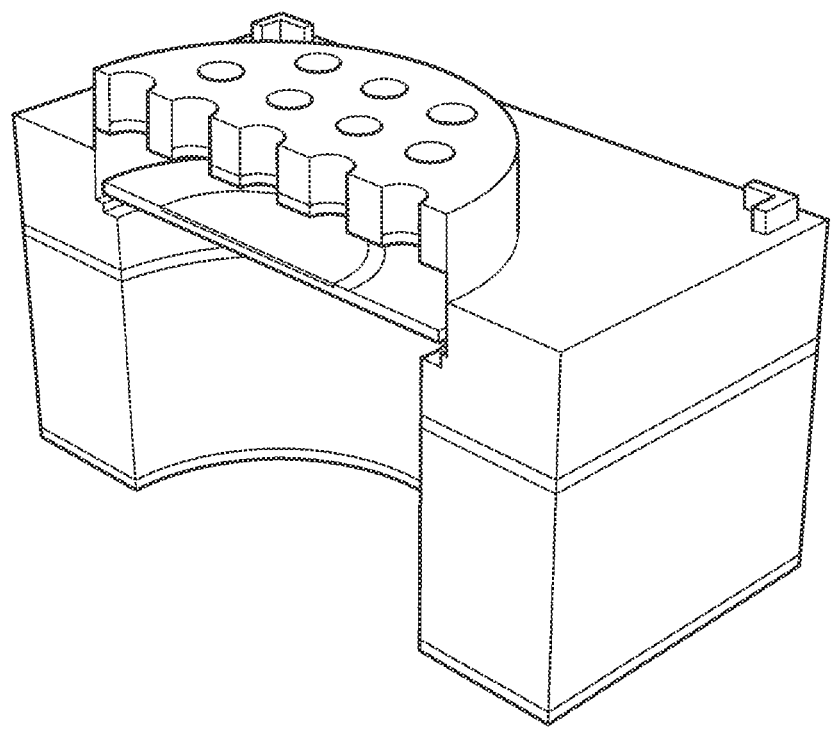
Figure 2A:
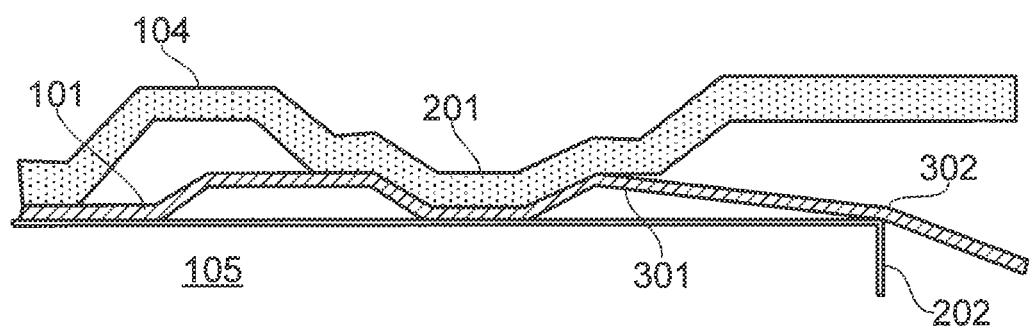
FIGS. 2a and 2b illustrate how a high pressure event may affect the membrane
Figure 2B:
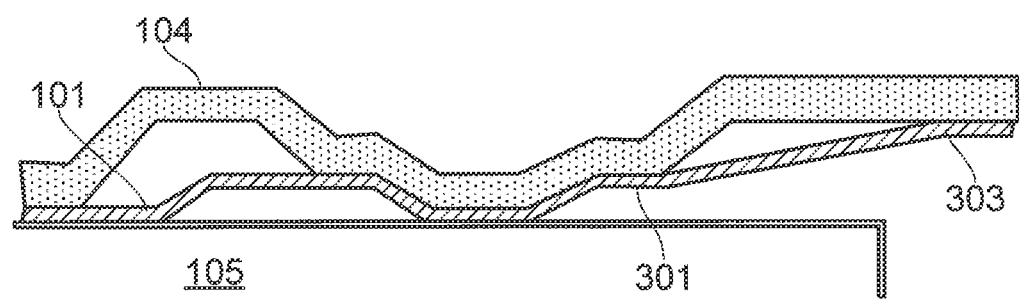

Embodiments of the present invention relate to MEMS transducers comprising a transducer structure comprising a flexible membrane supported between a first volume and a second volume. The first volume may for instance comprise the first cavity 109 between the membrane and the substrate and/or the volume formed in the substrate 108. The second volume may comprise the second cavity 110 between the membrane and back-plate and /or any volume in fluid communication with the second cavity (e.g. a sound port in top-port embodiments).

To reduce the likelihood of damage in high pressure situations the transducer structure comprises at least one vent structure in communication with at least one of said first and second volumes. The vent structure comprises at least one moveable portion which is moveable in response to a pressure differential across the vent structure.

FIGS. 4a-4c, 5a-5c and 6a-6c illustrate a flexible membrane 501 according to a first example.

Referring to the example illustrated in FIGS. 4a-4c, 5a-5c and 6a-6c, the flexible membrane 501 comprises a vent structure having three moveable portions 502a, 502b, 502c. In this example each of the moveable portions are irregular polygons and are connected to the rest of the membrane by a joint structure. In this example the joint structure comprises a connecting portion 505 and a beam structure 503.

Each of the moveable portions is formed by a channel 403 which extends from an upper surface of the membrane to a lower surface of the channel. The channel 403, which may be formed by etching through the membrane, partially separates each of the moveable portions from the rest of the membrane 501. Each of the beam structures is formed by a secondary channel 504, which extends through the membrane and which may be formed by etching through the membrane.

Figure 3A:
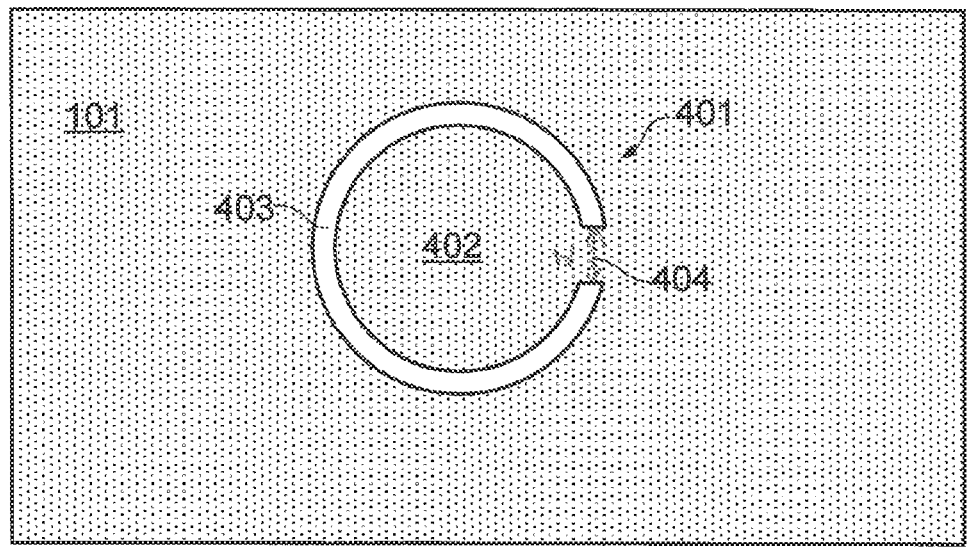
FIGS. 3a-3c illustrate a known variable vent structure.
Figure 3B:
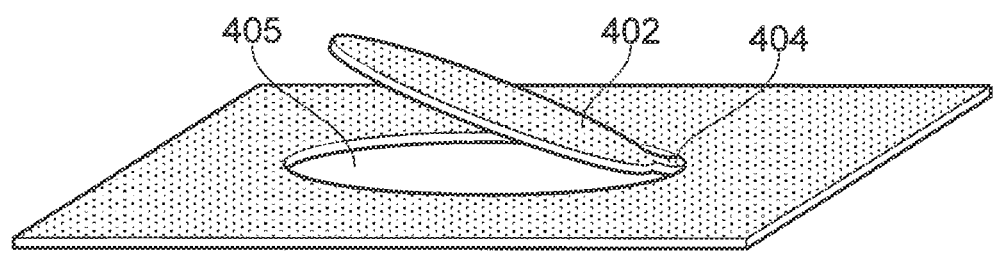
Figure 3C:
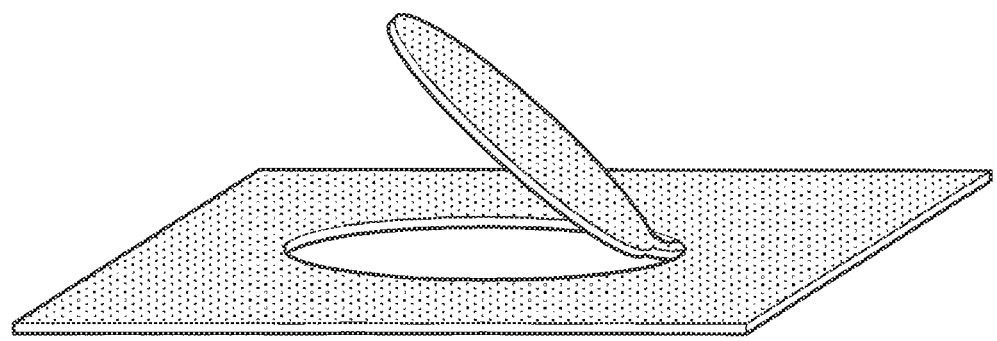

The connecting portion comprises a portion or "neck" of membrane material which is defined by the terminating ends, or the terminating regions, of the channel 403. Referring back to FIG. 3a for example, it will be appreciated that a connecting portion comprising a very shallow neck of membrane material may be formed directly between the terminating ends of a channel 403. The distance between the terminating ends represents the width w of the connecting portion. Alternatively, as illustrated by the flap 502b of FIG. 4a, the terminating regions of the channel 403 extend inwardly towards a central region of the moveable portion to thereby define a more pronounced neck of membrane material having a width w. A width of the connecting portion defined between the terminating regions of the channel can be considered to be the distance between a first point on one terminating region of the channel and a corresponding point on the other terminating region of the channel.

Figure 4A:
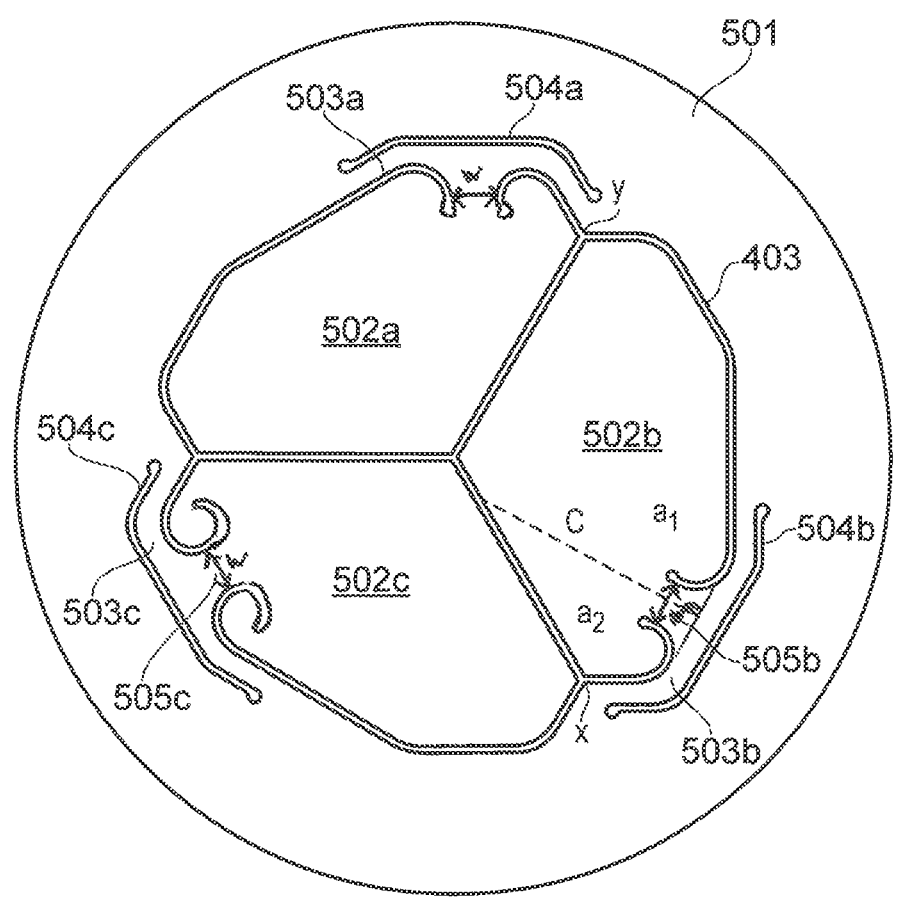

As a further example, and as illustrated by the flap 502c of FIG. 4a, the terminating regions of the channel may define a C- or U-shaped path such that a line drawn between the terminating ends will intersect the channel. In this case, it will be appreciated that although the connecting portion is not provided directly between the terminating ends of the channel 403, the connecting portion is still the neck of membrane material that is defined between the terminating regions of the channel. Each of the moveable portions is connected to the rest of the membrane along a connecting edge that is generally coincident with a cooperating edge of the membrane. The connecting edge of the moveable portion is separated from the rest of the membrane by the channel 403 except at the joint structure. In this example the joint structure is provided at an off-centre position on the connecting edge of the moveable portion. It will be appreciated that the "connecting edge" of the moveable portion is defined as the edge incorporating the joint and extending between the points X and Y shown on FIG. 4a.

It will of course be appreciated that the channel 403 does represent a path for air to flow through the membrane, however the channel 403 may be formed with a very narrow width and thus there will be minimal or negligible air flow through the channel when the moveable flap portions are in the equilibrium position whereby the moveable portions tessellate to substantially close the aperture.

The width of channel 403 may be limited by the photolithographic process constraints on the minimum etchable gap, or the need for some mechanical clearance for the moveable element(s) to bend and flex yet clear the rest of the structure. Also narrow gaps will tend to have a larger fractional manufacturing tolerance, leading to a wider variation in the acoustic impedance when closed and thus a wider variation in of e.g. the low-frequency roll-off a microphone. A typical width might be 1 µm, relative to a typical vent structure of 20 µm to 50 µm in extent. However the width might be ten times smaller or larger depending on the acoustic specifications or the manufacturing process capability. As mentioned the line width of the channels defining the moveable vent part may influence factors such as the low-frequency roll-off. In choosing appropriate line widths the effect of different widths may be simulated and/or different designs could be fabricated and tested.

Figure 4B:
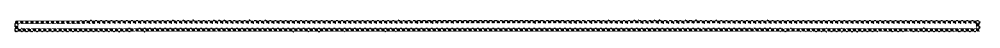
Figure 4C:
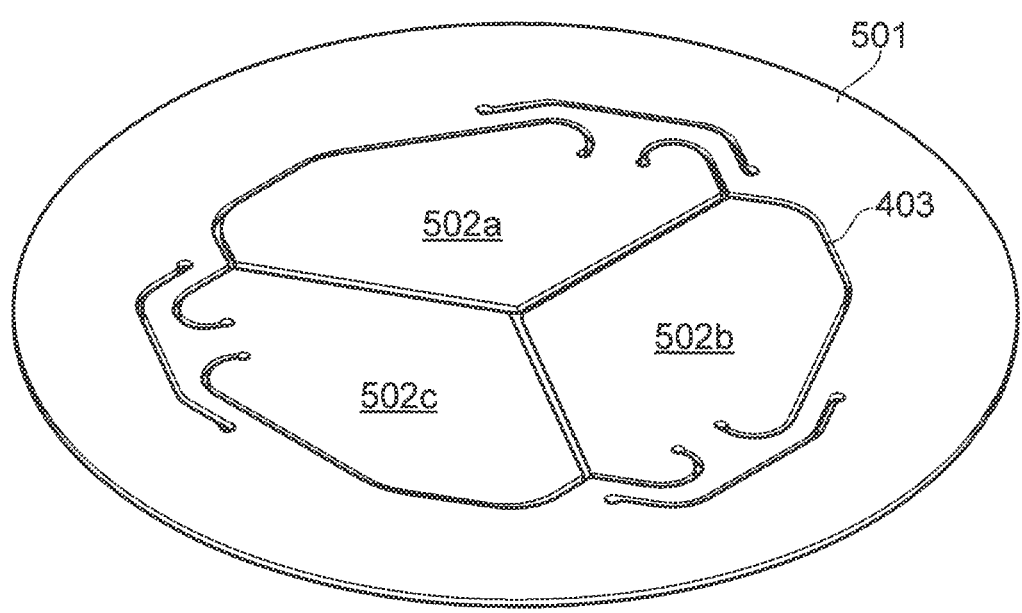
Figure 5A:
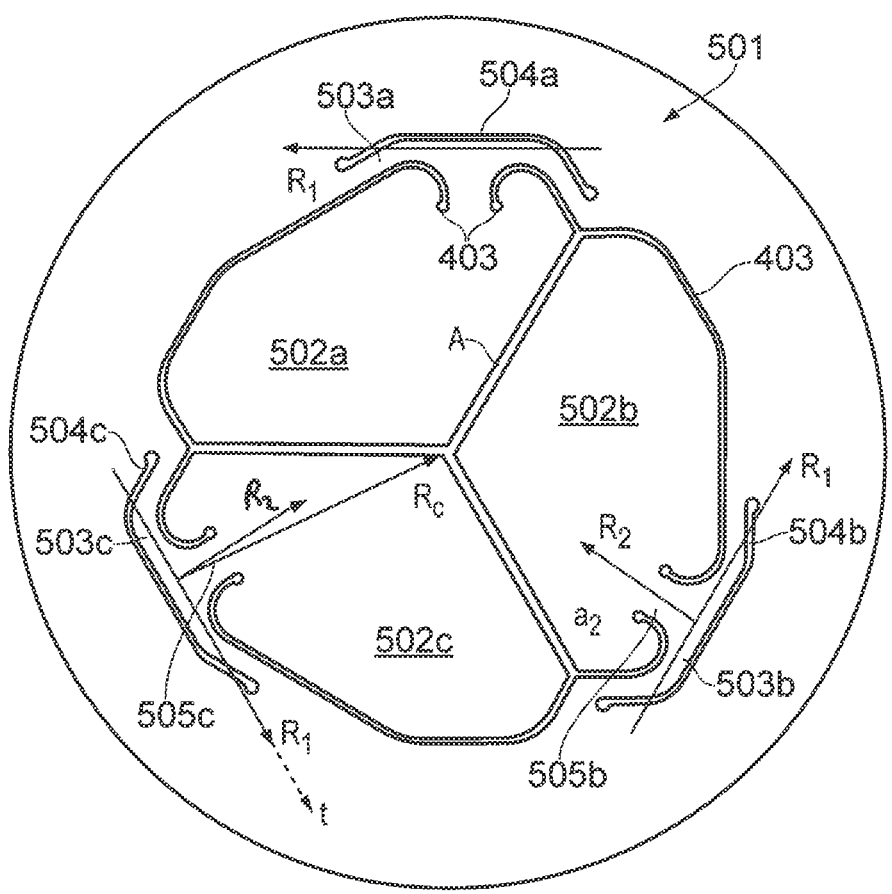
FIGS. 5a-5c illustrate a flexible membrane having vent structure according to the first example under circumstances of a first pressure differential across the vent.
Figure 5B:
Figure 5C:
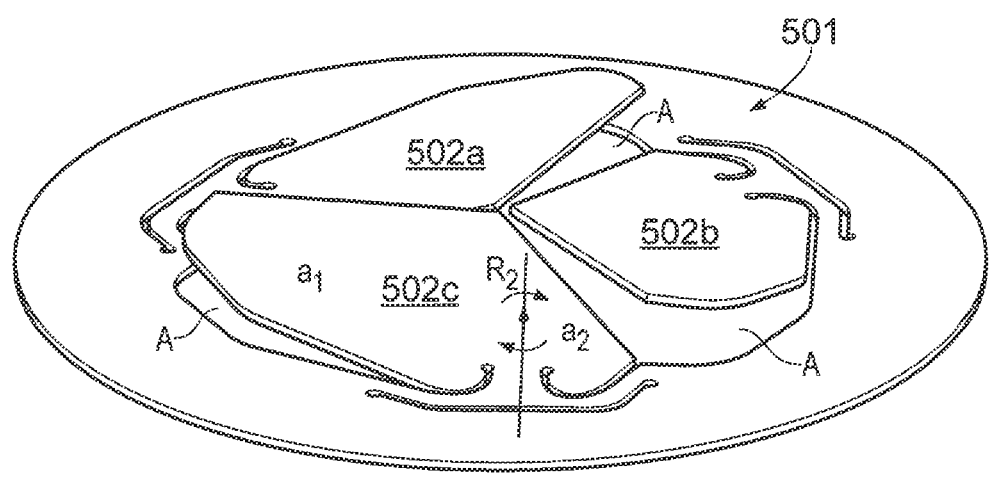
Figure 6A:
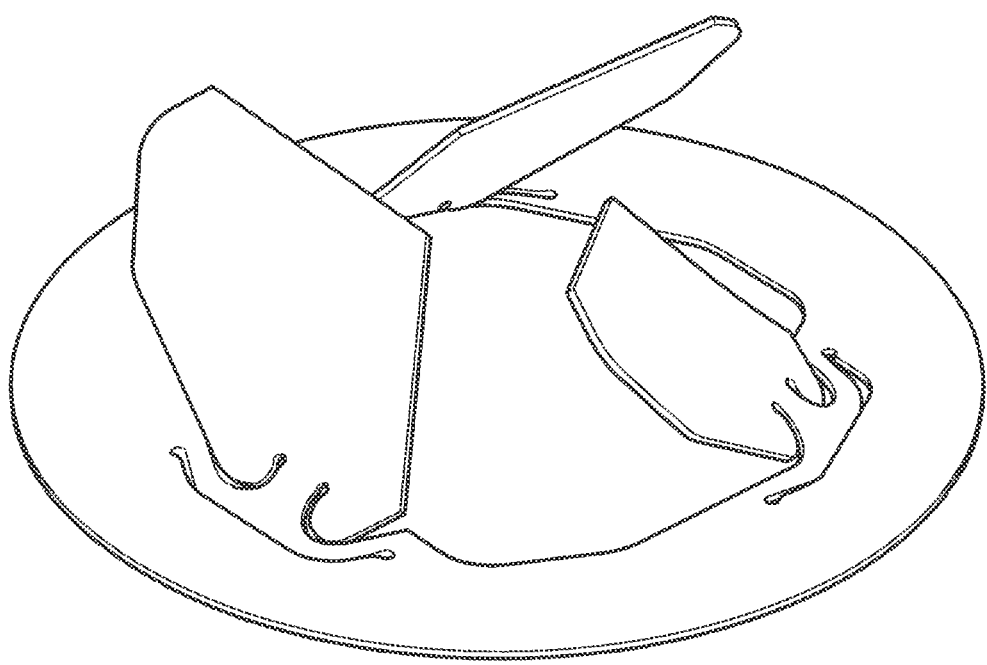
FIGS. 6a-6c illustrate a flexible membrane having vent structure according to the first example under circumstances of a second pressure differential across the vent.
Figure 6B:
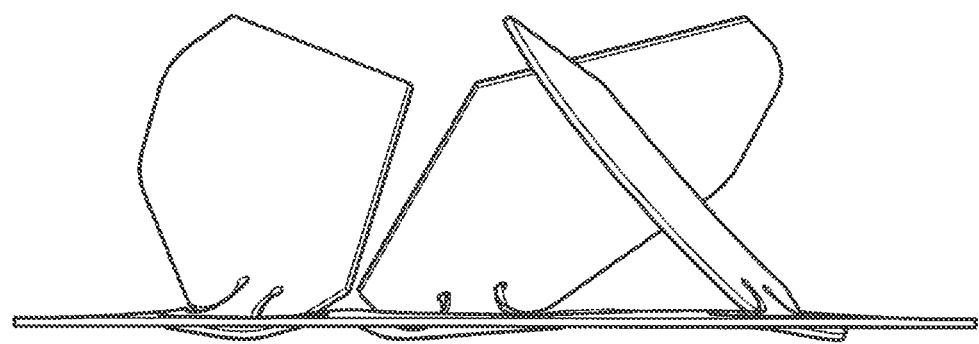
Figure 6C:
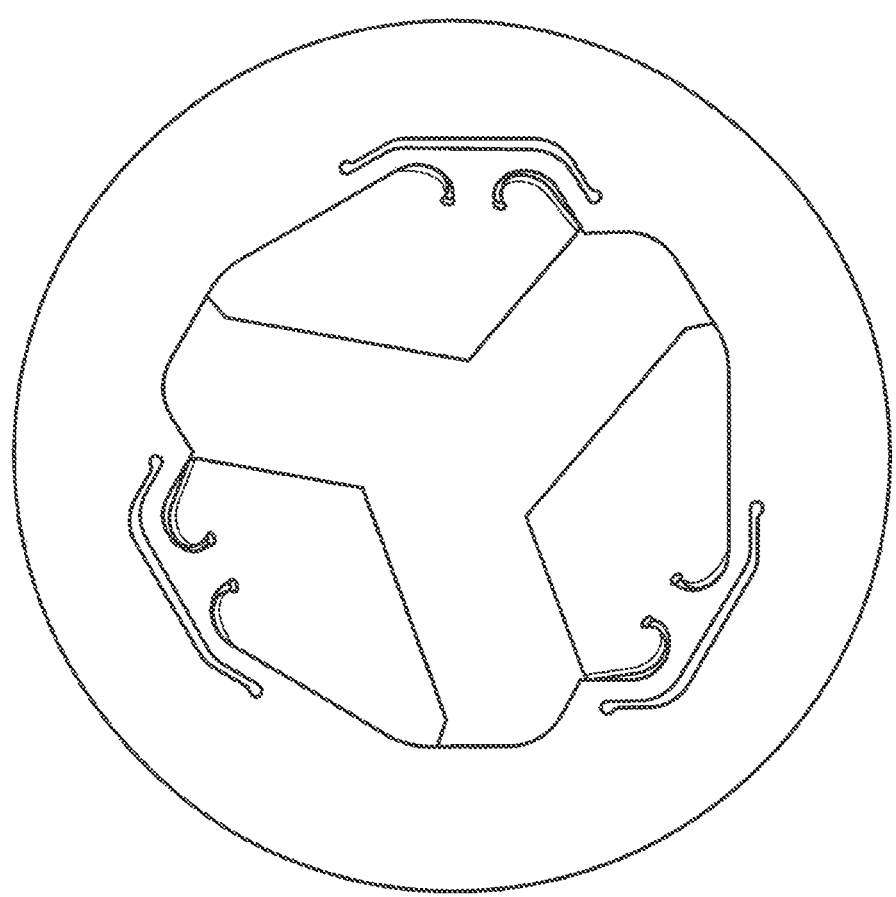

FIGS. 4a, 4b and 4c show the vent structure in a substantially closed, or "equilibrium", state when the pressure differential across the membrane is zero or close to zero. FIGS. 5a, 5b and 5c show the positions of the moveable portions of the vent structure at a first, relatively low, pressure differential. FIGS. 6a, 6b and 6c show the positions of the moveable portions of the vent structure at a second, relatively high, pressure differential.

FIGS. 4a, 4b and 4c respectively shows plan, side and elevational views of the flexible membrane 501 when the pressure differential across the membrane is zero or close to zero and the moveable portions 502a, 502b and 502c are therefore substantially in plane, or "flush" with the planar surface of the membrane. In this case the flow path through the membrane is substantially closed (with any, minimal, airflow through the membrane depending on the size of the channel 403).

With reference to FIG. 4a, which shows a plan view from an upper surface of the flexible, the moveable portions 502 can be seen to exhibit an irregular polygon shape. Each of the moveable portions can be considered to extend either side of a notional "centre-line" C which extends from the centre of the joint structure across the moveable portion in a direction that is substantially orthogonal to a line coincident with, or parallel to, the width w of the connecting portion. The centre-line C dissects the moveable portion into first and second sections a1 and a2. The moveable portion 502 is asymmetrical about the notional centre-line C and the first section a1 can be seen to exhibit a larger surface area than the second section a2.

Following an event which gives rise to a pressure differential between the pressure experienced on the upper and lower surfaces of the membrane, the moveable portions deflect out of the plane of the membrane. FIGS. 5a, 5b and 5c respectively show plan, side and elevational views of the flexible membrane 501 under circumstances of a first pressure differential across the vent. As can be seen most clearly from FIGS. 5b and 5c, each of the moveable portions 502 has been rotated about first and second rotational axes R1 and R2 (shown on FIG. 5a), thereby causing the moveable portion to deflect away from the rest of the membrane so as to reveal an aperture A in the membrane. The aperture A provides a flow path through the membrane.

The first rotational axis R1 of each moveable portion is substantially coincident with, or parallel to, the elongate portion of the beam 503. The aperture A can be considered to be generally circular (although it will be appreciated that, in this example, the outer edges of the aperture are formed of straight edges). Thus, the first rotational axis R1 can be considered to have a tangential component t—i.e. a component that can be resolved tangentially with respect to the vent structure or aperture. In this particular example the first rotational axis is substantially coincident with the tangential component.

The second rotational axis R2 extends across the vent structure in the plane of the membrane. Thus R2 has a component Rc which extends from the joint structure towards the centre of the vent structure in the plane of the membrane. The second rotational axis R2 may be substantially orthogonal to the first rotational axis R1.

Considering the rotational axis that is taken about the first rotational axis R1, it can be seen that the first pressure differential acting on the moveable portion has caused rotation about R1 so as deflect the moveable portion upwardly, out of the plane of the membrane.

From FIGS. 5b and 5c, it can be seen that as a result of the first pressure differential acting across the vent structure, the rotational movement that takes place about the second rotational axis R2 tends to cause the movable portions to "tilt". Thus, the lateral edge of section a1 of the moveable portion has been deflected upwardly with respect to the plane of the membrane, whilst the lateral edge of section a2 of the moveable portion has been deflected downwardly with respect to the plane of the membrane. Since the amount of rotation that has taken place about the first rotational axis R1 is relatively small, the lateral edge of section a2 of the moveable portion that has been deflected downwardly about R2 actually projects slightly below the surface of the membrane. This can be seen in FIG. 5b.

At this relatively low differential pressure, when the vent structure is closer to the equilibrium position, a pressure differential across the vent tends to give rise to a greater rotation about R2 than R1. Continued deflection of the moveable portions about the second axis of rotation tends to cause a larger proportion of the aperture to be revealed (and thus a larger flow path) than would be revealed as a result of rotation about the R1. This enables the vent structure to open more quickly from the equilibrium position in response to a high pressure event and, thus, for a larger aperture to be revealed in response to relatively low pressure differentials. This beneficially enables a faster equalisation of the relative pressure above and below the membrane, thereby protecting the transducer from potential damage.

FIGS. 6a, 6b and 6c respectively show plan, side and elevational views of the flexible membrane 501 under circumstances of a second pressure differential across the vent, the second pressure differential being higher than the first pressure differential discussed above with reference to FIG. 5. In this case the moveable portions have experienced a large deflection as a result of the differential pressure across the vent structure. Specifically, rotation about the first axis R1 which is provided by torsion or twisting of the beam 503, tends to cause the moveable portions 502 to be deflected upwardly towards a plane that is orthogonal to the plane of the rest of the membrane. At this relatively high differential pressure, continued deflection of the moveable portion portions tends to take place about R1.

The/each moveable portion of the vent structure may rotate about either or both of the rotational axes in response to a differential pressure across the membrane. For example, considering the pressure profile that occurs following an event which cause trapped air to be forced into a sound port of a host device, e.g. due to the host device falling an impacting with a surface. The pressure of the sound port will rise over a certain time and will reach a peak pressure differential before diminishing as the vent structure opens to equalise the pressure across the vent. As the air pressure increases, the/each moveable portion may initially rotate around an axis having a component that is perpendicular to the hinge in the horizontal plane (the "second rotational axis"). As the pressure continues to rise, the/each moveable portion may also simultaneously rotate about the first axis. Then, at higher pressure, the/each movable portion may rotate around an axis having a component that is substantially parallel to the joint structure in the horizontal plane (the "first" rotational axis).

The vent structure shown in FIGS. 4a-4c, 5a-5c and 6a-6c comprises three moveable portions arranged around the periphery of the membrane aperture A. Although it will be appreciated that this design can be generalised to incorporate any number of moveable portions, of any shape including club/clover shaped, this configuration has been found to be particularly beneficial since it balances the contradictory objectives of speed of response, which is proportional to the number of moveable portions, and the "leakage" (i.e. air flow through the membrane that takes place when the vent is in the equilibrium position) associated with providing more channels in the membrane to define the moveable portions.

Figure 7A:
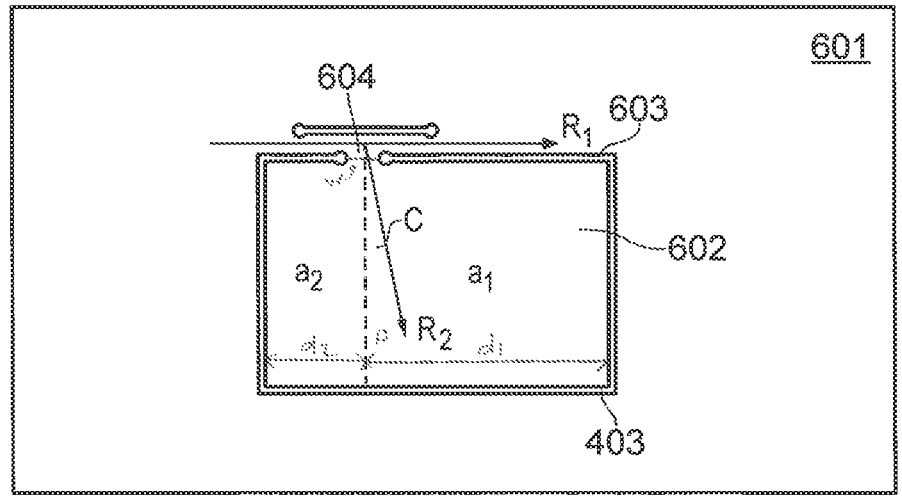
FIGS. 7a and 7b illustrate a number of other vent structures exemplifying the present invention.
Figure 7B:
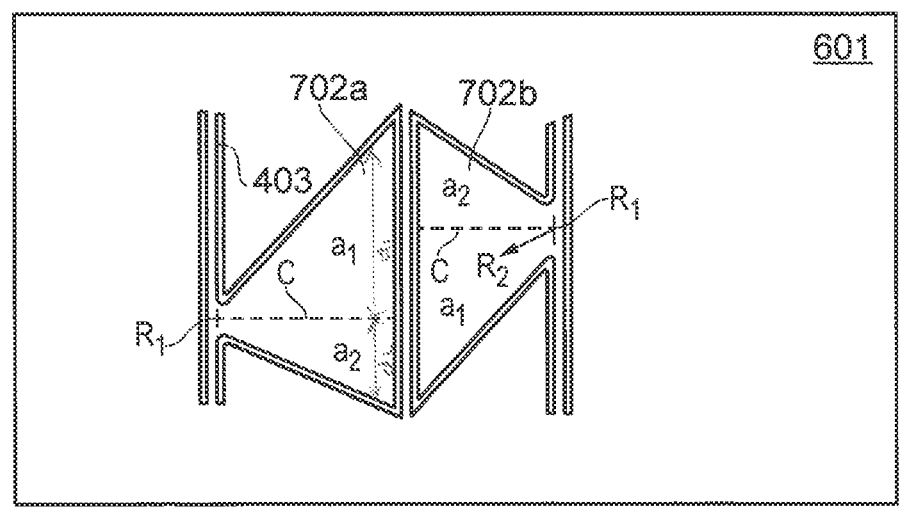

FIGS. 7a and 7b show example further vent structures.

FIG. 7a shows a flexible membrane 601 for a MEMs transducer comprising a single moveable portion 602. The moveable portion 602 extends either side of a notional "centre-line" C which extends from the centre of the joint structure 604 across the moveable portion in a direction that is substantially orthogonal to a line drawn widthways across, or across a width of, the connecting portion. Thus, the centre-line C dissects the moveable portion into first and second sections a1 and a2. The moveable portion 602 is asymmetrical about the notional centre-line C and the first section a1 can be seen to exhibit a larger surface area than the second section a2. Starting from a point P on the centre line C, the distance of a first line d1 drawn substantially orthogonally from the point P to a lateral edge of the first section a1 of the moveable portion is d1, is greater than the distance of a second line drawn substantially orthogonally from the point P to the lateral edge of the second section a2.

The moveable portion is connected to the rest of the membrane along a connecting edge 603 at a position that is offset from the centre of the connecting edge. In response to a differential pressure across the membrane 601, the moveable portion can rotate about first and second rotational axes R1 and R2.

The vent may act as a non-linear vent, which is a vent whose flow path size is not fixed and in which the extent to which the vent is open, and also flow rate through the vent, varies with pressure differential in a non-linear way.

FIG. 7b show a flexible membrane 601 for a MEMS transducer comprising two moveable portions 702a and 702b each being connected to the rest of the membrane by means of a connecting portion.

Embodiments of the invention therefore relate generally to MEMS transducers comprising a transducer structure including a flexible membrane supported between a first volume and a second volume and at least one vent structure. The vent structure has at least one moveable portion which is moveable in response to a high pressure differential across the moveable portion so as to provide a flow path for venting fluid, e.g. gas from at least one of said first and second volumes.

The embodiments have been described in terms of venting air from a volume. The same principles apply to other gases and indeed other fluids, possibly including liquids. In some embodiments the transducer may be arranged in a sealed environment which is filled with a fluid other than air, the sealed environment being arranged to allow transmission of pressure waves to/from outside the sealed environment. There may still be large pressure differentials that can be generated within the sealed environment and the use of variable vents in such embodiments may be beneficial.

Embodiments of the present invention also relate to MEMS transducers comprising a flexible membrane supported between a first volume and a second volume and a vent structure connecting said first and second volumes. The vent provides a flow path having a size that varies with pressure differential across the membrane.

Embodiments of the invention also relate to MEMS transducers having a membrane supported between first and second volumes wherein the acoustic impendence between the first and second volumes is variable with the differential pressure between the volumes.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, laptops, mobile phones, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

One or more transducers according to the any of the embodiments described above may be incorporated in a package. FIGS. 8a to 8g illustrate various different packaging arrangements. FIGS. 8a to 8g each show one transducer element located in the package but it will be appreciated that in some embodiments there may be more one than transducer, e.g. a transducer array, and the various transducers may be formed on the same transducer substrate, i.e. a monolithic transducer substrate, or may be formed as separate transducers with separate transducer substrates each separate transducer substrate being bonded to a package substrate.

FIG. 8a shows a first arrangement where a transducer 1100 is located in a cover 1101, which forms at least part of a housing, on a package substrate 1102. The cover in this example could be a metallic housing which is bonded to the substrate. The package substrate may comprise at least one insulating layer. The package substrate may also comprise at least one conductive layer. The package substrate may be a semiconductor material or may be formed from a material such as PCB, ceramic or the like. Where the cover 1101 is metallic, or itself comprises a conductive layer, the cover may be electrically coupled to the conductive layer of the substrate, e.g. so that the housing provides shielding for electromagnetic interference (EMI). Bond wires 1103 may connect the transducer to bond pads on the package substrate. In some embodiments, read-out circuitry, for instance amplifier circuitry, may be located within the housing formed in or connected to the package substrate. Through-vias through the package substrate (not illustrated) may connect to contacts, i.e. solder pads, 1104 for electrically connecting external circuitry (not illustrated) to the package to allow transmission of electrical signals to/from the transducer 1100. In the example shown in FIG. 8a there is a sound port or acoustic port in the cover 1101 to allow sound to enter the package and the transducer is arranged in a top port arrangement.

FIG. 8b illustrates an alternative arrangement where the sound port is provided in the package substrate 1102 and may, in use, be sealed. A ring 1105, which may be a sealing ring or a solder pad ring (for use in forming a solder ring) may be provided around the periphery of the sound port on the outer side of the package to allow, in use, sealing of a sound path leading to the sound port when the package is connected to another PCB for example. In this embodiment the transducer is arranged in a bottom port arrangement with the volume defined by the housing 1101 forming part of the back-volume of the transducer.

FIG. 8c illustrates an example where instead of bond wires connecting the transducer to the package substrate the transducer structure is inverted and flip-chip bonded to package substrate via connections 1106. In this example the sound port is in the package substrate such that the package is arranged in a bottom port arrangement.

FIG. 8d illustrates an alternative example to that of FIG. 8b wherein a housing 1107 is formed from various panels of material, for example PCB or the like. In this instance the housing 1107 may comprise one or more conductive layers and/or one or more insulating layers. FIG. 8d shows the sound port in the package substrate. FIG. 8e shows an alternative arrangement to that of FIG. 8b wherein a housing 1107 is formed from various panels of material, for example PCB or the like as described in relation to FIG. 8d. FIG. 8f shows a further embodiment where the transducer structure is bonded via connections 1106 to the housing upper layer, which may for instance be PCB or layered conductive/insulating material. In this example however the electrical connections to the package are still via contacts, solder pads, 1104 on the package substrate, e.g. through-vias (not illustrated) in the package substrate with conductive traces on the inside of the housing to the transducer. FIG. 8g illustrates an alternative example to that of FIG. 8c wherein a transducer is flip-chip bonded to the package substrate in a housing 1107 formed from panels of material, for example PCB or the like as described in relation to FIG. 8d.

In general, as illustrated in FIG. 8h, one or more transducers may be located in a package, the package is then operatively interconnected to another substrate, such as a mother-board, as known in the art.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising: a flexible membrane, the flexible membrane having a vent structure comprising at least one moveable portion, wherein the moveable portion is connected to the rest of the membrane by a connecting portion having a width, and wherein the moveable portion is asymmetrical about a notional line which extends from the center of the connecting portion across the moveable portion in a direction that is substantially orthogonal to the width of the connecting portion.

2. A MEMS transducer comprising:
a flexible membrane, the flexible membrane having a vent structure comprising at least one moveable portion connected to a remainder of the membrane by a single joint structure, the vent structure being configured such that, in response to a differential pressure across the vent structure, the moveable portion is rotatable about first and second axes of rotation, which axes of rotation extend in the plane of the membrane when the vent structure is at an equilibrium position, wherein the first axis of rotation and the second axis of rotation intersect at the joint structure.

3. A MEMS transducer as claimed in claim 2, wherein the joint structure comprises a connecting portion having a width and wherein the first axis of rotation has a component that is substantially coincident with, or parallel to, the width of the connecting portion in the plane of the membrane.

4. A MEMS transducer as claimed in claim 2, wherein the second axis of rotation has a component that is substantially perpendicular to the first axis of rotation.

5. A MEMS transducer as claimed in claim 2, wherein rotation about the first axis of rotation tends to cause the moveable portion to deflect above or below the plane of the membrane.

6. A MEMS transducer as claimed in claim 2, wherein rotation about the second axis of rotation tends to cause the respective moveable portion to tilt relative to the plane of the membrane.

7. A MEMS transducer as claimed in claim 2, wherein the first and second axes of rotation are mutually orthogonal.

8. A MEMS transducer comprising a flexible membrane, the flexible membrane having a vent structure comprising at least one moveable portion, wherein the/each moveable portion is connected to a remainder of the membrane by a single joint structure having a connecting portion, the vent structure being configured such that, in response to a differential pressure across the vent structure, the moveable portion is rotatable about an axis of rotation which has a component perpendicular to a width of the connecting portion.

9. A MEMS transducer comprising:
aa flexible membrane, the flexible membrane having a vent structure comprising at least one moveable portion, wherein the moveable portion is connected to the rest of the membrane by a connecting portion having a width, and wherein a notional line
which extends from the center of the connecting portion across the moveable portion in a direction that is substantially orthogonal to the width of the connecting portion, dissects the moveable portion into first and second sections, the first section having a greater surface area than the second section.

10. A MEMS transducer comprising: a flexible membrane, the flexible membrane having a vent structure comprising at least one moveable portion and a joint structure provided on a connecting edge of the moveable portion which connects the moveable portion to a remainder of the flexible membrane, wherein the joint structure is provided at an off-center position on the connecting edge.

11. A MEMS transducer as claimed in claim 1, wherein, in response to a differential pressure across the vent structure, the moveable portion is rotatable about an axis of rotation that has a component perpendicular to the width of the connecting portion in the plane of the moveable portion.

12. A MEMS transducer as claimed in claim 1, wherein the moveable portion rotates to expose an aperture in the membrane to thereby by provide a flow path through the membrane.

13. A MEMS transducer as claimed in claim 12, wherein the vent structure comprises three moveable portions which are arranged around the outer periphery of the aperture in the membrane.

14. A MEMS transducer as claimed in claim 1, wherein the, or each, moveable portion has an equilibrium position at which the pressure differential across the membrane is negligible and at which the flow path through the vent structure is at a minimum.

15. A MEMS transducer as claimed in claim 1, wherein the flexible membrane is supported between a first volume and a second volume and wherein the flow path is between the first and second volumes.

16. A MEMS transducer as claimed in claim 1, wherein the at least one moveable portion of the flexible membrane is defined by one or more channels running through the flexible membrane.

17. A MEMS transducer as claimed in claim 1, wherein the at least one moveable portion is an irregular polygon.

18. A MEMS transducer as claimed in claim 1, wherein said moveable portion is connected to the rest of the flexible membrane via a beam structure.

19. A MEMS transducer as claimed in claim 1, comprising a back-plate structure wherein the flexible membrane is supported with respect to said back-plate structure.

20. A MEMS transducer as claimed in claim 19 wherein said back-plate structure comprises a plurality of holes through the back-plate structure.

21. A MEMS transducer comprising a vent structure formed in a membrane of the vent structure, the vent structure comprising a moveable portion connected to the membrane by a joint structure, wherein the moveable portion, in response to a differential pressure across the vent structure, tilts laterally relative to the joint structure such that one lateral edge of the moveable portion deflects below the plane of the membrane whilst an opposite lateral edge of the moveable portion deflects above the plane of the membrane.

22. A MEMS transducer as claimed in claim 1, wherein said transducer comprises a capacitive sensor.

23. A MEMS transducer as claimed in claim 1, wherein said transducer comprises a microphone.

24. A MEMS transducer as claimed in claim 22 further comprising readout circuitry.

25. A MEMS transducer as claimed in claim 24, wherein the readout circuitry may comprise analogue and/or digital circuitry.

26. A MEMS transducer as claimed in claim 1, wherein the transducer is located within a package having a sound port.

27. An electronic device comprising a MEMS transducer as claimed in claim 1.

28. An electronic device as claimed in claim 27 wherein said device is at least one of: a portable device; a battery powered device; an audio device; a computing device; a communications device; a personal media player; a mobile telephone; a games device; and a voice controlled device.

29. An integrated circuit comprising a MEMS transducer as claimed in claim 1 and readout circuitry.

30. A method of fabricating a MEMS transducer having a flexible membrane, the method comprising:
    forming a structure having a flexible membrane supported between a first volume and a second volume; and
    forming at least one vent structure in communication with at least one of said first and second volumes, said at least one vent structure comprising at least one moveable portion connected to a remainder of the flexible membrane by a joint structure wherein, in response to a differential pressure across the vent structure, the moveable portion is rotatable about an axis of rotation which has a component that is perpendicular to a width of the joint structure in the plane of the membrane.

31. A method of fabricating a MEMS transducer having a flexible membrane, the method comprising:
    forming a structure having a flexible membrane supported between a first volume and a second volume; and
    forming at least one vent structure in communication with at least one of said first and second volumes, said at least one vent structure comprising at least one moveable portion and
    forming a joint structure on a connecting edge of the moveable portion which connects the moveable portion to a remainder of the flexible membrane, wherein the joint structure is formed at an off-center position on the connecting edge.

32. A method as claimed in claim 30 comprising forming a membrane layer to form at least part of said flexible membrane and forming at least one said vent structure in said membrane layer.

33. A method as claimed in claim 30 wherein forming said vent structure comprises forming one or more channels through the membrane layer so that a portion of the flexible membrane can be deflected away from the surface of the rest of the flexible membrane in response to a pressure differential.

* * * * *

UNITED STATES PATENT AND TRADEMARK OFFICE
CERTIFICATE OF CORRECTION

PATENT NO. : 10,266,393 B2
APPLICATION NO. : 15/414178
DATED : April 23, 2019
INVENTOR(S) : Colin Wei Hong Chung, Scott Lyall Cargill and Colin Robert Jenkins It is certified that error appears in the above-identified patent and that said Letters Patent is hereby corrected as shown below:

On the Title Page

Item (57), under "ABSTRACT", in Column 2, Line 3, delete "structure The" and insert -- structure. The --, therefor.

In the Specification

In Column 3, Lines 23-29, delete "MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer." and insert the same at Line 22 after "for a" as a continuation paragraph.

In Column 9, Line 57, delete "membrane" and insert -- membrane; --, therefor.

In Column 11, Line 43, delete "respectively shows" and insert -- respectively show --, therefor.

In Column 14, Line 1, delete "FIG. 7b show" and insert -- FIG. 7b shows --, therefor.

In the Claims

Column 16, Lines 65-67 to Column 17, Lines 1-9, should read:
9. A MEMS transducer comprising:
 a flexible membrane, the flexible membrane having a vent structure comprising at least one moveable portion, wherein the moveable portion is connected to the rest of the membrane by a connecting portion having a width, and wherein a notional line,
 which extends from the center of the connecting portion across the moveable portion in a direction that is substantially orthogonal to the width of the connecting portion, dissects the moveable portion into first and second sections, the first section having a greater surface area than the second section.

Signed and Sealed this
Tenth Day of September, 2019

Andrei Iancu
*Director of the United States Patent and Trademark Office*

CERTIFICATE OF CORRECTION (continued)
U.S. Pat. No. 10,266,393 B2

Column 18, Lines 37-49, should read:

31. A method of fabricating a MEMS transducer having a flexible membrane, the method comprising:

forming a structure having a flexible membrane supported between a first volume and a second volume; and forming at least one vent structure in communication with at least one of said first and second volumes, said at least one vent structure comprising at least one moveable portion; and forming a joint structure on a connecting edge of the moveable portion which connects the moveable portion to a remainder of the flexible membrane, wherein the joint structure is formed at an off-center position on the connecting edge.